(12) United States Patent
Yu

(10) Patent No.: US 6,372,589 B1
(45) Date of Patent: Apr. 16, 2002

(54) METHOD OF FORMING ULTRA-SHALLOW SOURCE/DRAIN EXTENSION BY IMPURITY DIFFUSION FROM DOPED DIELECTRIC SPACER

(75) Inventor: Bin Yu, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/552,050

(22) Filed: Apr. 19, 2000

(51) Int. Cl.[7] .......................................... H01L 21/336
(52) U.S. Cl. ................... 438/304; 438/197; 438/299; 438/510; 438/558; 438/563; 438/564
(58) Field of Search ................. 438/231, 232, 438/304, 558, 562, 563, 564, 197, 299, 301, 303–305, 307, 510, 545, 554, 559

(56) References Cited

U.S. PATENT DOCUMENTS

| | | | |
|---|---|---|---|
| 4,209,350 A | * | 6/1980 | Ho et al. .................... 438/305 |
| 4,683,645 A | | 8/1987 | Naguib et al. |
| 4,727,038 A | | 2/1988 | Watabe et al. |
| 4,745,082 A | | 5/1988 | Kwok |
| 4,784,718 A | | 11/1988 | Mitani et al. |
| 5,264,382 A | | 11/1993 | Watanabe |
| 5,374,575 A | | 12/1994 | Kim et al. |
| 5,391,510 A | | 2/1995 | Ksu et al. |
| 5,393,685 A | | 2/1995 | Yoo et al. |
| 5,429,956 A | | 7/1995 | Shell et al. |
| 5,491,099 A | | 2/1996 | Hsu |
| 5,593,907 A | | 1/1997 | Anjum et al. |
| 5,595,919 A | | 1/1997 | Pan |
| 5,607,884 A | | 3/1997 | Byun |
| 5,675,159 A | | 10/1997 | Oku et al. |
| 5,716,861 A | | 2/1998 | Moslehi |
| 5,736,446 A | | 4/1998 | Wu |
| 5,793,090 A | | 8/1998 | Gardner et al. |
| 5,811,323 A | | 9/1998 | Miyasaka et al. |
| 5,825,066 A | | 10/1998 | Buynoski |
| 5,856,225 A | | 1/1999 | Lee et al. |
| 5,858,843 A | | 1/1999 | Doyle et al. |
| 5,915,182 A | | 6/1999 | Wu |
| 5,915,196 A | | 6/1999 | Mineji |
| 5,926,715 A | * | 7/1999 | Fan et al. .................... 438/305 |
| 5,946,580 A | * | 8/1999 | Wu ............................ 438/303 |
| 5,989,966 A | * | 11/1999 | Huang ........................ 438/305 |
| 6,030,863 A | * | 2/2000 | Chang et al. ............... 438/229 |
| 6,093,594 A | * | 7/2000 | Yeap et al. ................. 438/231 |
| 6,093,610 A | * | 7/2000 | Rodder ...................... 438/289 |

FOREIGN PATENT DOCUMENTS

| | | |
|---|---|---|
| JP | 3-248433 | 11/1991 |
| JP | 4-123439 | 4/1992 |
| JP | 5-160396 | 6/1993 |

OTHER PUBLICATIONS

"Sub–100nm Gate Length Metal Gate NMOS Transistors Fabricated by a Replacement Gate Process" Chatterjee, et al. Dec. 7–101997 IEEE.
"Sub 50 nm FinFET: PMOS" Huang, et al. 1999 IEEE.
"Ultra–Thin–Body Silicon–On Insulator MOSFET's for Terabit–Scale Integration" by Yu, et al.

* cited by examiner

Primary Examiner—Matthew Smith
Assistant Examiner—Craig P. Little
(74) Attorney, Agent, or Firm—Foley & Lardner

(57) ABSTRACT

A method of fabricating an integrated circuit (IC) with source and drain extension regions. Advantageously, the source and drain extension regions are formed without damage related to integrated circuit implant techniques. Damage is avoided by using solid phase doping to form extension regions. Generally, a doped material is provided adjacent to a transistor gate structure and the IC is annealed. During the annealing process, dopants from the doped material diffuse into the semiconductor substrate to form the source and drain extension regions. The process can be utilized for P-channel or N-channel metal oxide field semiconductor effect transistors (MOSFETs).

20 Claims, 5 Drawing Sheets

METHOD OF FORMING ULTRA-SHALLOW SOURCE/DRAIN EXTENSION BY IMPURITY DIFFUSION FROM DOPED DIELECTRIC SPACER

CROSS REFERENCE TO RELATED APPLICATIONS

This patent application is related to U.S. application Ser. No. 09/187,635, by Yu et al., entitled "A Damascene Process for Forming Ultra-Shallow Source/Drain Extensions and Pocket in ULSI MOSFET", filed on Nov. 6, 1998, and assigned to the assignee of the present invention. This patent application is also related to U.S. application Ser. No. 09/1255,604, by Yu et al., entitled "A Process for Forming Ultra-Shallow Source/Drain Extensions", filed Feb. 22, 1999 and assigned to the assignee of the present invention. In addition, this patent application is related to U.S. application Ser. No. 09/255,546, by Yu, entitled "Locally Confined Deep Pocket Process For ULSI MOSFETS", filed and assigned to the assignee of the present invention.

FIELD OF THE INVENTION

The present invention relates to integrated circuits and methods of manufacturing integrated circuits. More particularly, the present invention relates to a method of manufacturing integrated circuits having transistors with shallow source/drain extension regions.

BACKGROUND OF THE INVENTION

Integrated circuits (ICs), such as, ultra-large scale integrated (ULSI) circuits, can include as many as one million transistors or more. The ULSI circuit often include complementary metal oxide semiconductor (CMOS) field effect transistors (FETS). The transistors can include semiconductor gates disposed between drain and source regions. The drain and source regions are typically heavily doped with a P-type dopant (boron) or an N-type dopant (phosphorous).

The drain and source regions generally include a thin extension that is disposed partially underneath the gate to enhance the transistor performance. Shallow source and drain extensions help to achieve immunity to short-channel effects which degrade transistor performance for both N-channel and P-channel transistors. Short-channel effects can cause threshold voltage roll-off and drain-induced barrier lowering. Both drain-induced barrier lowering and threshold voltage roll-off increases random process variation and degrades the robustness of the transistor. Shallow source and drain extensions and, hence, controlling short-channel effects, are particularly important as transistors become smaller.

Traditionally, source and drain regions along with shallow source and drain extensions are formed by a double implant process. In the double implant process, shallow source and drain extensions are formed by providing a transistor gate structure without sidewall spacers on a top surface of a silicon substrate. Next, an ion implantation process is used to dope the silicon substrate on both sides of the gate structure. Without the sidewall spacers on the gate structure, the implantation process introduces dopants into a thin region just below the top surface of the substrate to form the drain and source extensions. During formation of the source and drain extensions, the source and drain regions are also partially formed.

After the source and drain extensions are formed, insulating spacers, which abut lateral sides of the gate structure, are provided over the source and drain extensions. Next, a second implantation step is performed to form the deeper source and drain regions. The source and drain extensions are not further doped due to the blocking capability of the silicon dioxide spacers. Following formation of the source and drain regions and the source and drain extensions, a high-temperature thermal anneal is performed to activate dopants implanted in the regions.

Using ion implantation to form regions within a semiconductor substrate results in the following disadvantages: (1) dopant tail diffusion through the crystal lattice which causes short channel effects, (2) damage to the crystalline lattice caused by injecting high energy ions, and (3) inability to form ultra-shallow implant regions due to the limits of the implant mechanism. Damage to the crystalline lattice structure allows dopant to rapidly diffuse throughout the lattice. The disadvantages of ion implantation negatively effect proper formation of shallow source and drain extension regions. Further, the negative impact of ion implantation becomes more pronounced as dimension of the source and drain extensions are reduced to facilitate smaller transistor sizes. For example, the limited ability of implant mechanisms to perform low energy implants (e.g., less than 1 KeV) for most commonly used dopants such as Arsenic (As) and Boron (B) makes formation of shallow regions very difficult and highly variable. Rapid diffusion increases process variation and reduces transistor functionality.

Thus, a method of forming shallow source and drain extensions without ion implantation is needed. Further, there is a need for an efficient method of forming source and drain extension regions. Even further still, there is a need for transistors including shallow source and drain extensions with minimal crystal damage.

SUMMARY OF THE INVENTION

The present invention relates to a method of manufacturing an integrated circuit. The integrated circuit includes a gate structure between a source region and a drain region in a semiconductor substrate. The method includes providing a doped material adjacent to the gate structure and above the semiconductor substrate. Further, the method includes annealing the integrated circuit causing dopants in the doped material to diffuse into the semiconductor substrate forming an extension region.

The present invention further relates to a method of manufacturing an ultra-large scale integrated circuit including a plurality of field effect transistors having source and drain extension regions. The method includes steps of forming at least part of a gate structure on a top surface of a semiconductor substrate and between a source and a drain. The method further includes forming a protective spacer material abutting a wall of the gate structure. In addition, the method includes forming a doped material abutting the protective spacer and forming a second spacer material abutting the doped material, whereby the doped material is between the protective spacer material and the second spacer material. The method also includes doping the source and drain regions in the semiconductor material. In addition, the method includes annealing the integrated circuit to cause dopants from the doped material and dopants from the source and drain regions to diffuse and form extension regions.

The present invention also relates to an integrated circuit including a transistor. The transistor has a gate structure on a top surface of a semiconductor substrate and is disposed between a source and a drain. The transistor includes a source extension region and a drain extension region. Advantageously, the source and drain extension regions do not exhibit channeling effect or crystal damage from dopant implant.

BRIEF DESCRIPTION OF THE DRAWINGS

The exemplary embodiments will hereinafter be described with reference to the accompanying drawings, wherein like numerals denote like elements.

DETAILED DESCRIPTION OF THE PREFERRED EXEMPLARY EMBODIMENTS

Figure 1:
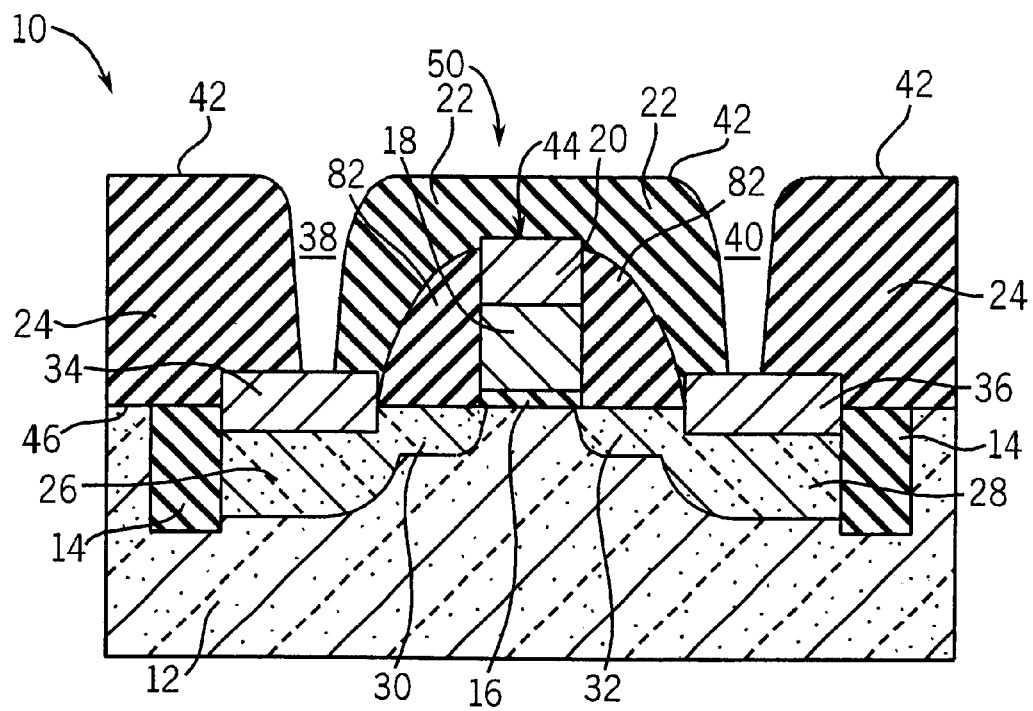
FIG. 1 is a cross-sectional view of a portion of an integrated circuit having shallow source and drain regions in accordance with the exemplary embodiment of the invention.

With reference to FIG. 1, a transistor 50 is disposed on a semiconductor substrate 12, such as, a single crystal semiconductor wafer. Transistor 50 is part of a portion 10 of an integrated circuit (IC) manufactured on a wafer (such as, a silicon wafer). Transistor 50 preferably has a gate length of less than 100 nanometers (nm). Alternatively, substrate 12 can be a thin-film layer that is part of a silicon-on-insulator substrate. Substrate 12 can be any semiconductor material, including gallium arsenide (GaAs), silicon (Si), germanium (Ge), or other material.

Transistor 50 includes a gate structure 44, a source region 26, and a drain region 28. Transistor 50 also includes a source extension 30 and a drain extension 32. In the exemplary embodiment, source region 26 and drain region 28 are 60–120 nm deep (60–120 nm below a top surface 46 of substrate 12). Transistor 50 can be an N-channel or P-channel field effect transistor (FET).

Extensions 30 and 32 are preferably ultra-shallow extensions (e.g., junction depth is less than 20–40 nm), which are thinner (i.e., shallower) than regions 26 and 28. Extensions 30 and 32 are connected to regions 26 and 28, respectively, and are disposed partially underneath a gate oxide 16. Ultra-shallow extensions 30 and 32 help transistor 50 achieve substantial immunity to short-channel effects. Short-channel effects can degrade performance of transistor 50, as well as the manufacturability of the IC associated with transistor 50. Regions 26 and 28 and, hence, extensions 30 and 32, have a concentration of $10^{19}$ to $10^{20}$ dopants per cubic centimeter.

Transistor 50 can be an N-channel or a P-channel metal oxide semiconductor field effect transistor (MOSFET). Transistor 50 is provided between two insulative structures 14, which can be shallow trench isolation or local oxidation of silicon (LOCOS) structures. Gate structure 44 is preferably 1000–2000 Å thick and includes a silicide layer 20, gate oxide 16, and a gate conductor 18. Gate oxide 16 is preferably thermally grown on substrate 12 to a thickness of 20–50 Å. Alternatively, oxide 16 can be an insulative layer, such as, a silicon nitride ($Si_3N_4$) or a silicon oxynitride (SiON), provided by chemical vapor deposition (CVD).

Conductor 18 is can be deposited by chemical vapor deposition (CVD) and with oxide 16, can be etched to form the particular gate structure 44 for transistor 50. Conductor 18 can be polysilicon or polysilicon/germanium doped with P-type or N-type dopants. Conductor 18 can also be a metal.

A silicide layer is formed over transistor 50. A portion 20 of the silicide layer is formed over gate conductor 18. Additionally, a portion 34 of the silicide layer is provided over source region 26, and a portion 36 of the silicide layer is provided over drain region 28. Portions 20, 34, and 36 are preferably 100–200 Å thick layers of titanium silicide ($TiSi_2$), nickel silicide ($NiSi_2$), cobalt silicide ($CoSi_2$), or other conductive materials. While FIG. 1 shows approximately 50 percent of portions 34 and 36 extending below top surface 46, preferably seventy percent (preferably, 70–140 Å) of portions 34 and 36 extend below top surface 46 of substrate 12. Portion 20 is similar to layers 34 and 36.

Most elements of transistor 50 can be manufactured according to conventional complementary metal oxide semiconductor (CMOS) process steps. Transistor 50 can be at least partially covered by insulative layer 42 in a CVD TEOS process and is preferably part of an ultra-large scale integrated (ULSI) circuit that includes 1,000,000 or more transistors. Insulative layer 42 is preferably 1000–2000 Å thick. Vias or holes 38 and 40 are etched in insulative layer 42 which form spacer sections 22 and sections 24.

With reference to FIGS. 2 through 9, the fabrication of transistor 50, including shallow extensions 30 and 32, is described below. Advantageously, the process forms extensions 30 and 32 without using ion implantation techniques which damage the crystal structure of substrate 12. Thus, shallow extension problems associated with ion implantation can be avoided.

Figure 2:
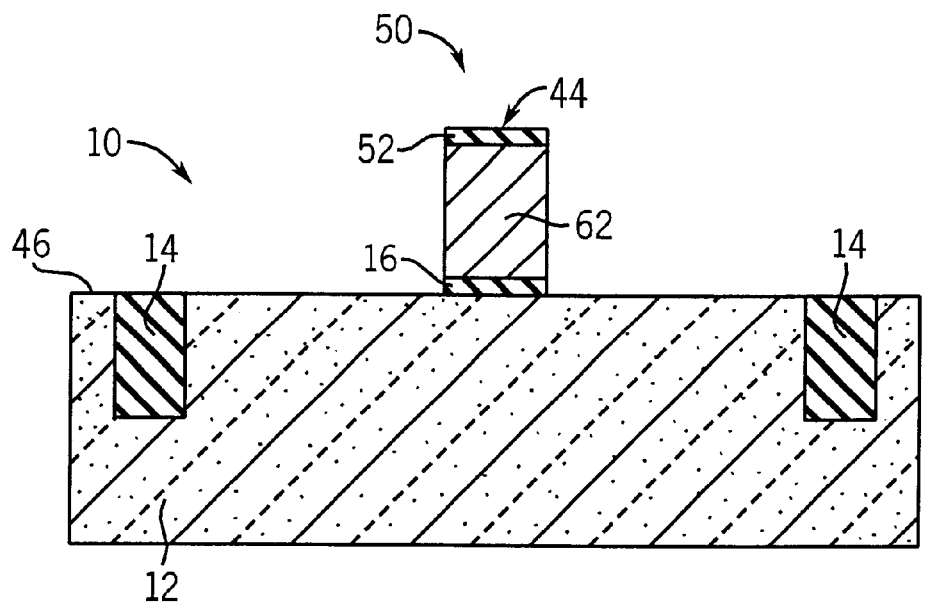
FIG. 2 is a cross-sectional view of the portion of the integrated circuit illustrated in FIG. 1, showing gate structure formation.

In FIG. 2, transistor 50 can be substantially formed by conventional semiconductor processing techniques to form gate structure 44, including gate oxide 16, sacrificial cap material 52, and gate conductor region 62. Gate structure 44 is provided over top surface 46 of substrate 12. Further, as noted with reference to FIG. 1, transistor 50 is provided between structures 14.

Preferably, sacrificial cap material 52 is a nitride material, such as, silicon nitride ($Si_3N_4$). Sacrificial cap material 52 (e.g., the thin nitride cap) is preferably between 100 and 200 Å thick. Sacrificial cap material 52 prevents gate polysilicon etch during subsequent material removal steps as explained below. Gate oxide 16 is preferably 20 to 50 Å thick and composed of an insulative material such as silicon dioxide ($SiO_2$) or silicon nitride ($Si_3N_4$). Gate conductor material 62 is preferably polysilicon material formed between 1000 and 2000 Å thick. Material 52, 62 and oxide 16 can be deposited by CVD and etched to leave structure 44.

Figure 3:
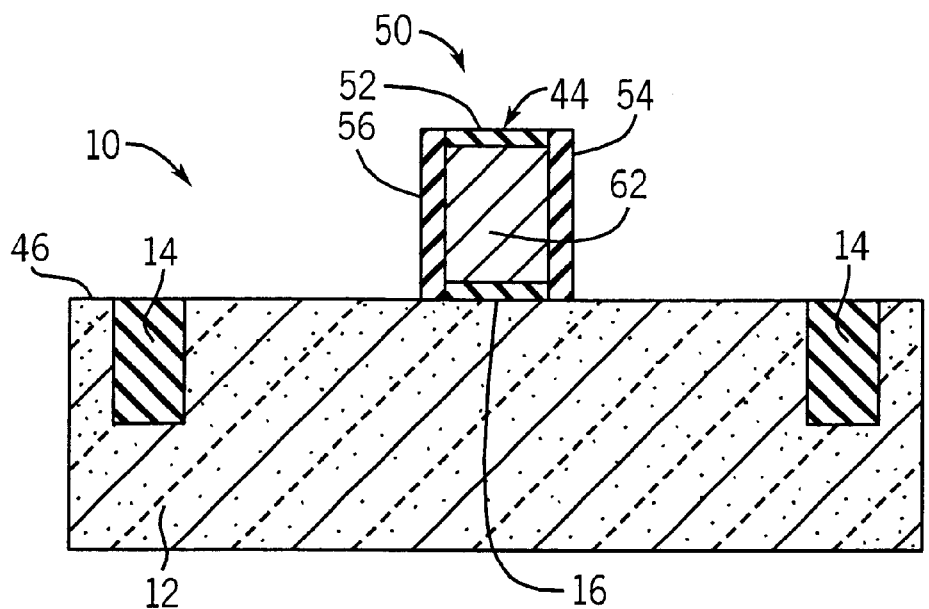
FIG. 3 is a cross-sectional view of the portion of the integrated circuit illustrated in FIG. 1, showing formation of sidewalls of the gate structure.

Referring now to FIG. 3, thin side walls or spacers 54 and 56 are formed on either side of gate structure 44. Spacers 54 and 56 are preferably formed on both sides of gate stack 44 by a regular CMOS deposit and etch process. Preferably, spacers 54 and 56 are formed less than 100 Å thick of nitride material, such as, silicon nitride ($Si_3N_4$) or silicon oxynitride (SiON). Thin spacers 54 and 56 serve to protect both gate oxide 16 and polysilicon 62 during subsequent processing steps discussed below. Preferably, spacers 54 and 56 are 100–200 Å wide and 1000–2000 Å tall (thick). Further, spacers 54 and 56 are formed by deposition and then etch-back process.

Figure 4:
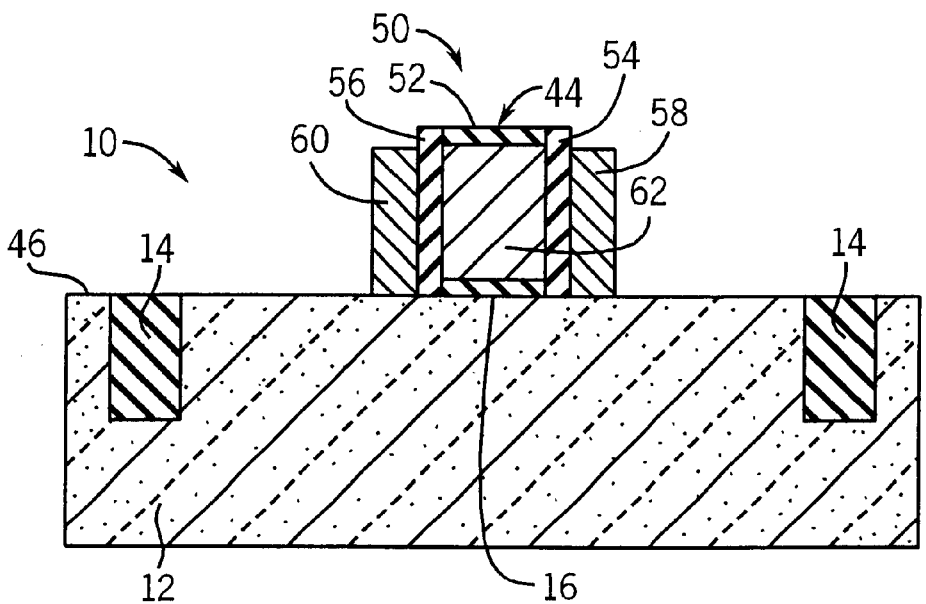
FIG. 4 is a cross-sectional view of the portion of the integrated circuit illustrated in FIG. 1, showing formation of dopant enhanced sidewalls of the gate structure.

Referring now to FIG. 4, doped spacers 58 and 60 are formed adjacent to thin spacers 54 and 56 on the sides of gate structure 44. Preferably, doped spacers 58 and 60 are approximately 300 Å wide. Doped spacers 58 and 60 can be either doped oxide spacers or doped polysilicon spacers and can be formed using conventional deposit and etch CMOS processes. Doped spacers 58 and 60 can be borosilicate glass (BSG), or phosphosilicate glass (PSG). Ultimately, doped spacers 58 and 60 are the solid phase dopant source used to form shallow source and drain extensions 30 and 32 (illustrated in FIG. 1) in subsequent steps described below. The spacers 58 and 60 are doped to a concentration of $1 \times 10^{20}$ to $5 \times 10^{21}$ dopants per centimeter cubic.

Figure 5:
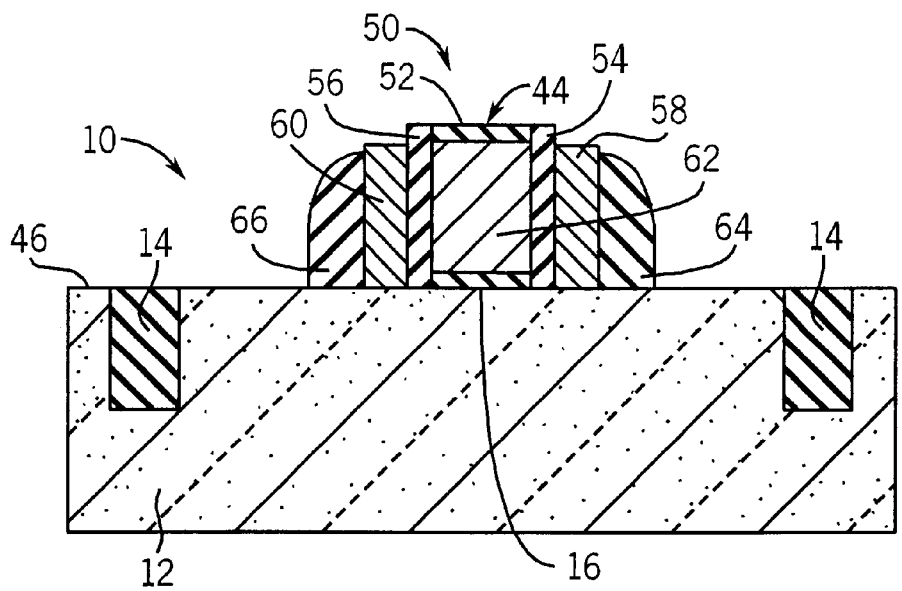
FIG. 5 is a cross-sectional view of the portion of the integrated circuit illustrated in FIG. 1, showing formation of sidewall spacers of the gate structure.

Turning now to FIG. 5, dummy spacers 64 and 66 are formed adjacent to doped spacers 58 and 60 on the sides of gate structure 44. Preferably, dummy spacers 64 and 66 are comprised of undoped oxide material, such as silicon dioxide ($SiO_2$), an formed less than 200 Å wide. Alternatively, other spacer materials, such as, silicon nitride ($Si_3N_4$), silicon oxynitride (SiON), or other insulators can be utilized for spacers 64 and 66. Dummy spacers 64 and 66 can be formed using conventional CMOS deposit and etch processes. Spacers 64 and 66 serve to separate deep source and drain regions 26 and 28 (illustrated in FIG. 1) from shallow source and drain extensions 30 and 32 (illustrated in FIG. 1). Therefore, the width of spacers 64 and 66 should be adjusted as a function of the depth of source and drain regions 26 and 28. The deeper the depth of the source and drain regions 26 and 28, the wider the spacers 64 and 66. This helps to avoid the lateral diffusion from source and drain (26 and 28) overrunning into the shallow source and drain extension regions (30 and 32).

Figure 6:
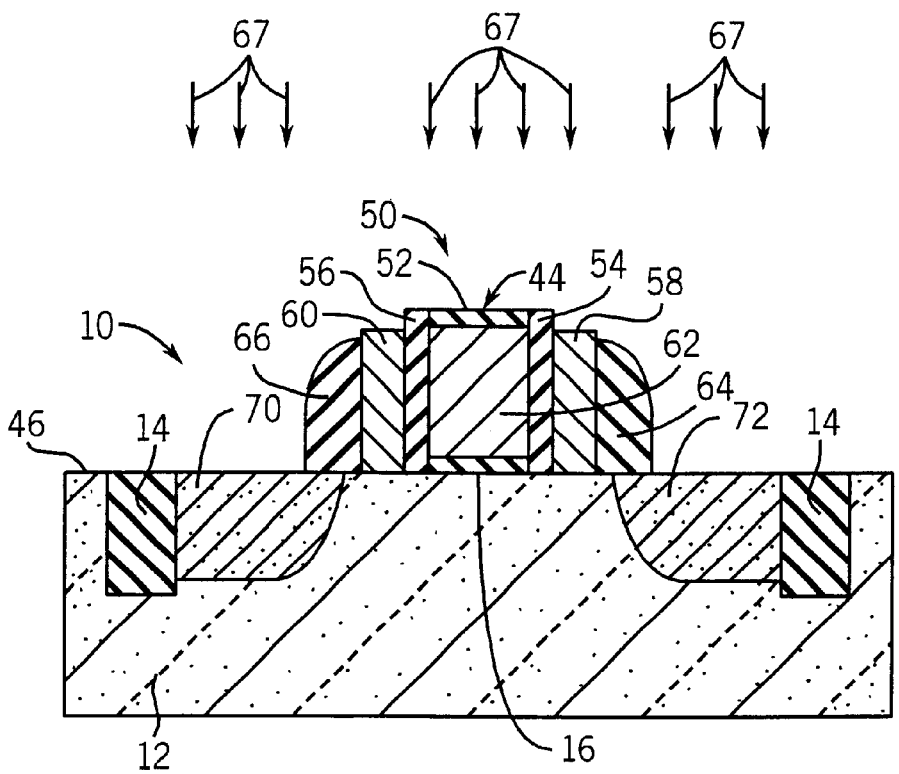
FIG. 6 is a cross-sectional view of the portion of the integrated circuit illustrated in FIG. 1, showing formation of source and drain regions.

Ultimately, formation of dummy spacers 64 and 66, doped spacers 58 and 66, and thin spacers 54 and 56 serve to guide formation of source and drain regions 26 and 28, as well as source and drain extensions 30 and 32. By forming multiple spacers, good control of source/drain doping is achieved. Referring now to FIG. 6, a dopant implant is performed to form deep source and drain regions 70 and 72. During the dopant implant, dopants 67 are implanted into source region 70 and drain region 72 of substrate 12. In addition, dopants 67 are implanted into polysilicon gate material 62. The dopant implant can be performed using conventional implantation devices manufactured by, for example, Varian Co. of Palo Alto, Calif. Preferable dopants 67 for n-channel devices can include arsenic (As), phosphorous (P), or any appropriate dopant for semiconductor fabrication operations. Alternatively, where a p-channel device is desired, preferable dopants 67 can include boron (B), boron difluoride ($BF_2$), or any appropriate dopant for semiconductor fabrication operations.

Figure 7:
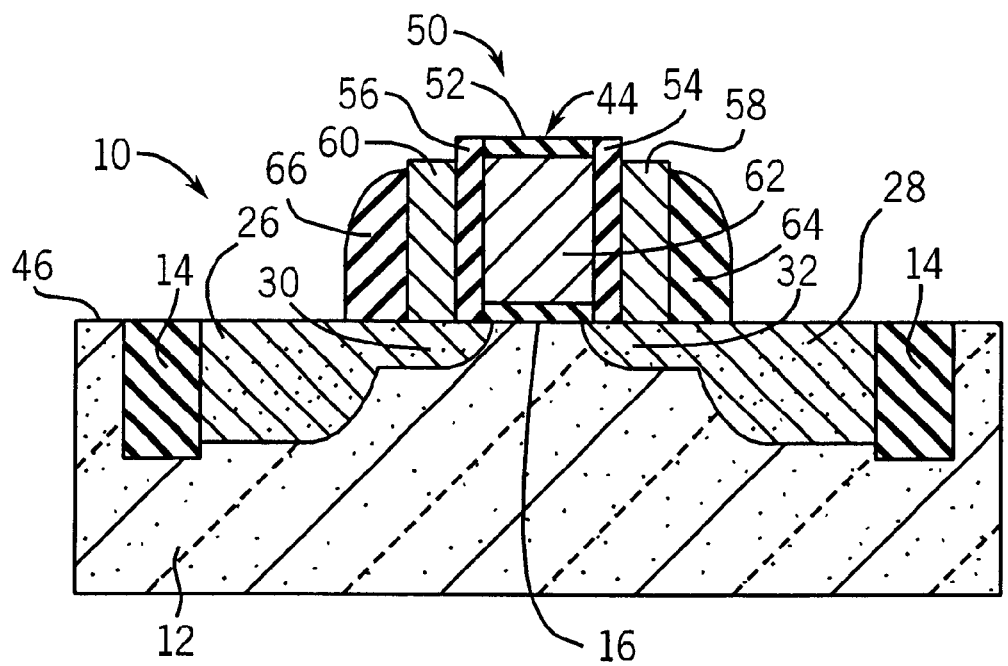
FIG. 7 is a cross-sectional view of the portion of the integrated circuit illustrated in FIG. 1, showing formation of source and drain extension regions.

After implanting dopants 67 to form regions 70 and 72 of FIG. 6, portion 10 is annealed using a high temperature thermal anneal (i.e. annealing at a temperature greater than 1100 degrees C.). Referring now to FIG. 7, the high temperature thermal anneal serves to activate dopants in source region 26, drain 30 region 28 and gate region 62.

Advantageously, during high temperature annealing, dopant in doped spacers 58 and 60 diffuses into substrate 12 and forms shallow source and drain extensions 30 and 32. Preferably, this diffusion provides a source/drain junction depth of 100 to 300 Å for a sub-100 nm transistor. The high temperature anneal also activates dopants in the source and drain extensions 30 and 32. Because the dopants for source and drain extensions 30 and 32 are diffused from a solid phase source (i.e., from doped spacers 58 and 60), neither channeling effects nor crystal damage to substrate 12 occur. Thus, doping the source and drain extensions 30 and 32 is accomplished by carefully controlling the thermal budget associated with the high temperature thermal anneal. Controlling the thermal budget allows for shallow source and drain extensions 30 and 32 to be formed by driving, via thermal diffusion, dopants from doped spacers 58 and 60 into substrate 12.

Figure 8:
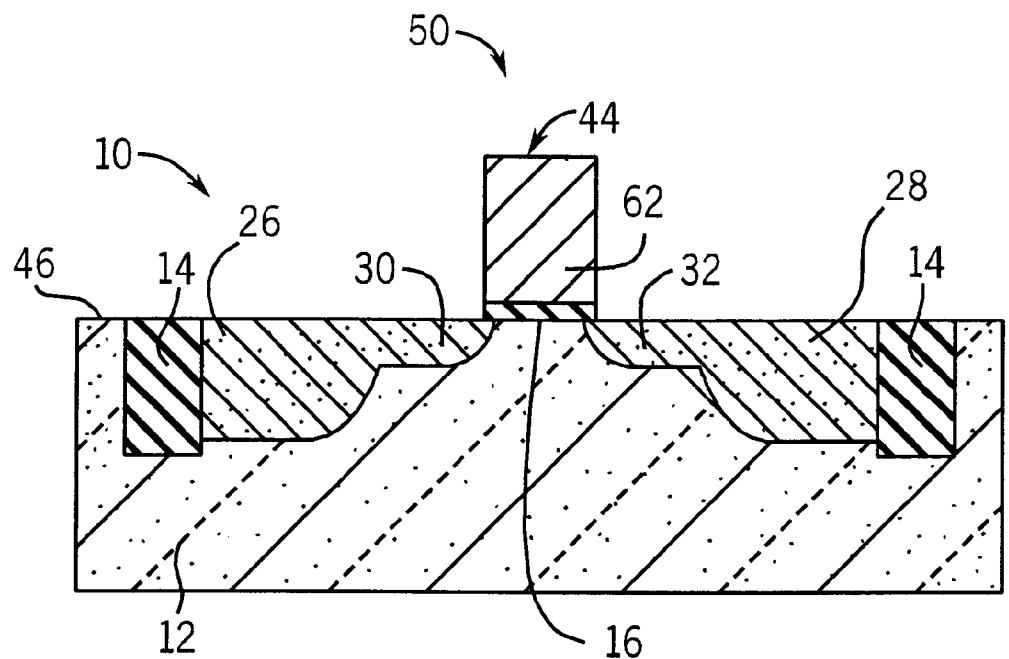
FIG. 8 is a cross-sectional view of the portion of the integrated circuit illustrated in FIG. 1, showing removal gate structure spacers, sidewalls, and cap.

Having activated dopants in the various regions and formed shallow source and drain extensions 30 and 32, dummy spacers 64 and 66, doped spacers 58 and 60, thin spacers 54 and 56, and sacrificial cap 52 are removed from around gate structure 44. Preferably, the removal is accomplished by wet etching selective to the various spacer materials, but other forms of removal can be used. Dummy spacers 64 and 66 can be removed using an etch selective to removal of material (silicon dioxide) comprising dummy spacers 64 and 66. Further, a wet etch selective of the material comprising doped spacers 58 and 60 is used to remove doped spacers 58 and 60. During removal of doped spacers 58 and 60, both gate material 62 and gate oxide 16 are protected by thin spacers 54 and 56. In the case where doped spacers 58 and 60 are doped polysilicon spacers, the polysilicon gate material 62 is protected by thin spacers 54 and 56 during an etch selective to polysilicon material. In addition, sacrificial cap 52, preferably comprised of a nitride material, protects gate material 62 during an etch selective to polysilicon material. Alternatively, where doped spacers 58 and 60 are doped oxide spacers, the gate oxide 16 is protected by thin spacers 54 and 56 during an etch selective to oxide material. A further etch is performed to remove sacrificial cap 52 and thin spacers 54 and 56. After the removal process is complete, portion 10 appears as illustrated in FIG. 8.

Figure 9:
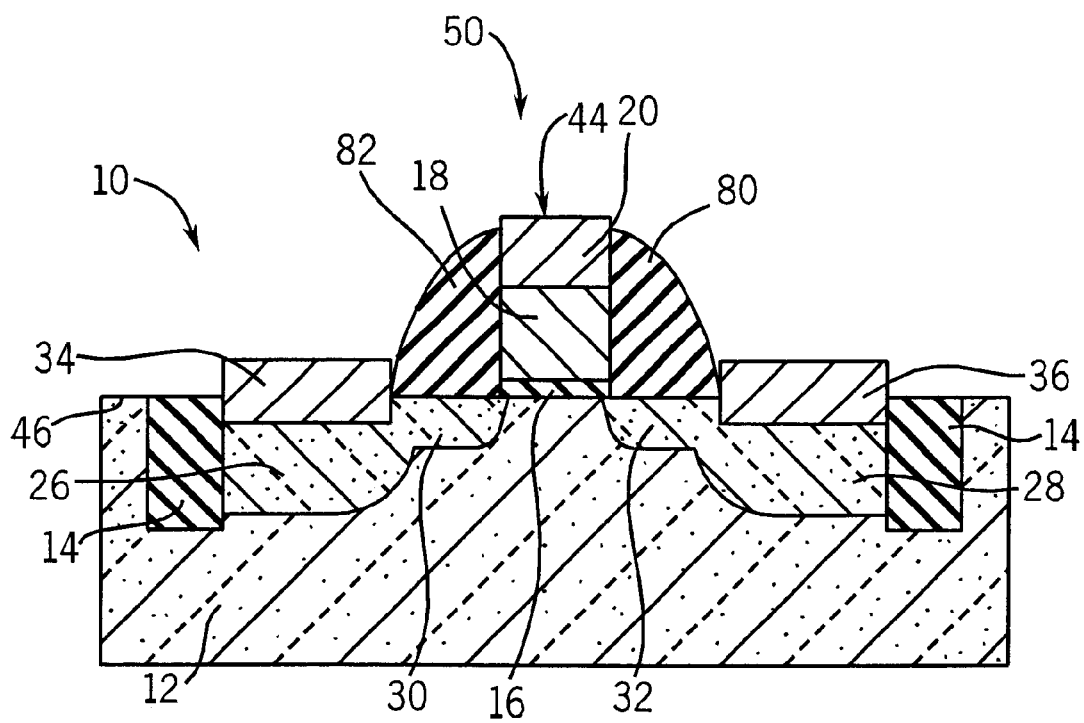
FIG. 9 is a cross-sectional view of the portion of the integrated circuit illustrated in FIG. 1, showing a silicidation step.

Referring now to FIG. 9, wide oxide spacers 80 and 82 are formed adjacent to gate structure 44. Preferably, wide oxide spacers 80 and 82 are comprised of an oxide material such as silicon dioxide ($SiO_2$) and are formed less than 600 Å wide. Wide oxide spacers 80 and 82 serve to separate silicidation regions 34 and 36 from gate structure 44. After formation of wide oxide spacers 80 and 82, portion 10 is subjected to a conventional silicidation process to form silicide portions 34, 36 and 20. Portions 34, 36 and 20 can be formed in a conventional process, wherein a refractory metal (e.g., Co, Ti, Ni) is deposited by CVD and reacted with exposed surfaces of silicon associated with conductor 18, region 26 and region 28.

Atoms of the refractory metal react with the exposed silicon (e.g., in a thermal process) to form silicide material. The refractory metal does not react with oxide spacers 80 and 82 nor insulative structures 14. Therefore, a silicide layer is not formed on oxide spacers 80 and 82 nor insulative structures 14. After the reaction, which forms portions 34, 36 and 20, the unreacted refractory metal is removed. Portions 34, 36 and 20 advantageously reduce contact resistance.

After silicidation, portion 10 is processed according to known processes to form portion 10 as illustrated in FIG. 1.

For example, insulative layer 42 is provided over transistor 50 (e.g., structure 44, portion 34 and portion 36). Insulative layer 42 is preferably silicon dioxide deposited in a tetraorthosilicate (TEOS) process at a low temperature (e.g., less than 400° C.). Insulative layer 42 is initially 500–1000 nm thick. Layer 42 is subjected to a chemical mechanical polish (CMP) to planarize layer 42. Layer 42 is etched to form vias 38 and 40 for contacts and local interconnects.

Subsequent formation of contacts, interconnect, and other IC structures for transistor 50 can be completed by any process known in the art, such as conventional CMOS processes to complete fabrication of portion 10.

It is understood that, while preferred embodiments, examples, materials, and values are given, they are for the purpose of illustration only. The apparatus and method of the invention are not limited to the precise details and conditions disclosed. For example, although wet-etching techniques are discussed, other methods could be utilized to remove structures. Thus, changes may be made to the details disclosed without departing from the spirit of the invention, which is defined by the following claims.

What is claimed is:

1. A method of manufacturing an integrated circuit, comprising:

providing a transistor having gate structure between a source region and a drain region in a semiconductor substrate, the gate structure having lateral side walls;

providing a doped material adjacent to a thin protective layer lining the lateral side walls of the gate structure and above the semiconductor substrate;

providing an undoped dielectric spacer adjacent to the doped material and above the semiconductor substrate, whereby the doped material is sandwiched between the thin protective layer and the undoped dielectric spacer; and annealing the integrated circuit, wherein dopants from the doped material diffuse into the semiconductor substrate to form an extension region.

2. The method of claim 1, wherein the thin protective layer is formed in a deposit and etch process.

3. The method of claim 2, wherein the undoped dielectric spacer is one of an oxide and nitride material.

4. The method of claim 3, wherein the source region and drain region are formed by implanting dopants into the semiconductor substrate before the annealing step, whereby the dielectric spacer partially defines at least one of the source and drain regions.

5. The method of claim 4, wherein the annealing step is accomplished at a temperature greater than 1100 degrees Celsius.

6. The method of claim 3, wherein the doped material is one of a doped polysilicon material and doped oxide material.

7. The method of claim 6, wherein the doped material is one of phosphorous doped oxide, boron doped oxide, phosphorous doped polysilicon, and boron doped polysilicon.

8. The method of claim 6, wherein the doped material is doped to a concentration of $1 \times 10^{20}$ to $5 \times 10^{21}$ dopants per centimeter squared.

9. The method of claim 3, wherein the thin protective layer and undoped dielectric spacer are one of silicon nitride, silicon dioxide, and silicon oxynitride.

10. The method of claim 1 further comprising:

depositing an oxide layer over the gate structure and the substrate after the annealing step.

11. A method of manufacturing an ultra-large scale integrated circuit including a plurality of field effect transistors having source and drain extension regions, the method comprising steps of:

forming at least part of a gate structure on a top surface of a semiconductor substrate;

forming a protective layer abutting a wall of the gate structure;

forming a doped material abutting the protective layer;

forming an undoped spacer material abutting the doped material, whereby the doped material is between the protective layer and the undoped spacer material;

doping source and drain regions in the semiconductor material, said doped regions positioned on opposite sides of the gate structure; and annealing the integrated circuit, wherein dopants from the doped material diffuse to at least partially form source and drain extension regions.

12. The method of claim 11, further comprising: removing the undoped spacer material, the doped material, and the protective layer after the annealing step.

13. The method of claim 12, wherein the removing step is a wet etch.

14. The method of claim 11, wherein the annealing step is accomplished at a temperature greater than 1100 degrees Celsius.

15. The method of claim 11, wherein the doped material is one of doped polysilicon material or doped oxide material.

16. The method of claim 15, wherein the doped material is one of phosphorous doped oxide, boron doped oxide, phosphorous doped polysilicon and boron doped polysilicon.

17. The method of claim 15, wherein the doped material is doped to a concentration of $1 \times 10^{20}$ to $5 \times 10^{21}$ dopants per centimeter squared.

18. The method of claim 11, wherein the protective layer is any of silicon nitride, silicon dioxide, or silicon oxynitride.

19. A method of manufacturing an integrated circuit including at least a transistor, the transistor including a gate structure on a top surface of a semiconductor substrate, the gate structure disposed between a source and a drain of the transistor, the method comprising steps of:

forming a thin protective layer abutting a wall of the gate structure;

forming a doped material abutting the thin protective layer; and forming an undoped spacer material abutting the doped material, whereby the doped material is between the thin protective layer and the undoped spacer material; and annealing the integrated circuit, wherein dopants from the doped material diffuse to form source and drain extension regions of the transistor, whereby the extension regions do not exhibit channeling effect or crystal damage from a dopant implant.

20. The method of claim 19, wherein the undoped spacer material is one of silicon nitride, silicon dioxide, and silicon oxynitride.

* * * * *